US010292314B2

(12) United States Patent
Harvey et al.

(10) Patent No.: US 10,292,314 B2
(45) Date of Patent: May 14, 2019

(54) COOLING SYSTEM FOR HIGH DENSITY HEAT LOADS

(71) Applicant: Liebert Corporation, Columbus, OH (US)

(72) Inventors: Thomas Harvey, Columbus, OH (US); Stephen Sillato, Westerville, OH (US)

(73) Assignee: Vertiv Corporation, Columbus, OH (US)

( * ) Notice: Subject to any disclaimer, the term of this patent is extended or adjusted under 35 U.S.C. 154(b) by 0 days.

(21) Appl. No.: 15/498,586

(22) Filed: Apr. 27, 2017

(65) Prior Publication Data

US 2017/0231120 A1 Aug. 10, 2017

Related U.S. Application Data

(62) Division of application No. 13/723,661, filed on Dec. 21, 2012, now Pat. No. 9,706,685.

(60) Provisional application No. 61/580,686, filed on Dec. 28, 2011.

(51) Int. Cl.
*H05K 7/20* (2006.01)

(52) U.S. Cl.
CPC ..... *H05K 7/20827* (2013.01); *H05K 7/20318* (2013.01); *H05K 7/20327* (2013.01); *H05K 7/20709* (2013.01); *H05K 7/20836* (2013.01)

(58) Field of Classification Search
CPC .......... H05K 7/20709; H05K 7/20836; H05K 7/20827; F25B 25/005; F25B 7/00; F25B 2400/06
See application file for complete search history.

(56) References Cited

U.S. PATENT DOCUMENTS

| 3,529,432 | A | 9/1970 | Nussbaum |
| 3,837,616 | A | 9/1974 | Castriota-Scanderbeg |
| 3,864,919 | A | 2/1975 | Frutschi |
| 4,490,836 | A | 12/1984 | Grotloh |
| 4,765,394 | A | 8/1988 | Ziegler |
| 4,842,017 | A | 6/1989 | Reynolds |
| 5,247,964 | A | 9/1993 | DeLange |
| 6,182,742 | B1 | 2/2001 | Takahashi et al. |
| 6,397,618 | B1 * | 6/2002 | Chu ............... F25B 25/00 165/104.22 |

(Continued)

FOREIGN PATENT DOCUMENTS

| CN | 1137824 A | 12/1996 |
| CN | 1625328 A | 6/2005 |

(Continued)

OTHER PUBLICATIONS

Emerson Network Power, "Ensuring Network Availability With Mission-Critical Cooling Technologies;" 2009, pp. 1-32.

(Continued)

*Primary Examiner* — Ana M Vazquez
(74) *Attorney, Agent, or Firm* — Harness, Dickey & Pierce, P.L.C.

(57) ABSTRACT

A pumped refrigerant cooling system having multiple pumping units for providing working fluid to a load to enable cooling of a space via the load. The pumped refrigerant cooling system operates the pumping units at less than capacity. When a pumping unit is deactivated, the output of the remaining pumping units is increased to maintain fluid flow.

41 Claims, 9 Drawing Sheets

(56) References Cited

U.S. PATENT DOCUMENTS

| | | | |
|---|---|---|---|
| 7,757,506 B2 | 7/2010 | Ellsworth, Jr. et al. | |
| 7,808,783 B2 * | 10/2010 | Goth | F25B 49/02 165/80.3 |
| 2004/0148956 A1 | 8/2004 | Arshansky et al. | |
| 2005/0120737 A1 | 6/2005 | Borror et al. | |
| 2005/0122684 A1 | 6/2005 | Chu et al. | |
| 2006/0102322 A1 | 5/2006 | Madara et al. | |
| 2009/0126909 A1 | 5/2009 | Ellsworth, Jr. et al. | |
| 2011/0063792 A1 | 3/2011 | Schmidt et al. | |
| 2011/0100602 A1 | 5/2011 | Kinkel | |
| 2011/0168379 A1 | 7/2011 | Morgan et al. | |
| 2012/0312033 A1 | 12/2012 | Lingelbach et al. | |
| 2013/0092640 A1 | 4/2013 | Cassidy et al. | |
| 2014/0137582 A1 | 5/2014 | Louvar et al. | |

FOREIGN PATENT DOCUMENTS

| | | |
|---|---|---|
| CN | 1625329 A | 6/2005 |
| CN | 1890515 A | 1/2007 |
| CN | 1902448 A | 1/2007 |
| CN | 101389866 A | 3/2009 |
| CN | 101442893 A | 5/2009 |
| CN | 102269444 A | 12/2011 |

OTHER PUBLICATIONS

Chinese Office Action for Application No. 2012105991675 dated Mar. 23, 2016, and its English translation thereof.
English translation of Chinese Office Action for Application No. 2012105991675 dated Nov. 29, 2016.
English translation of Chinese Office Action for Application No. 2012105991675 dated May 24, 2017.
English translation of Chinese Office Action for Application No. 2012105991675 dated Nov. 13, 2017.
English Translation of Chinese Office Action for Application No. 2012105991675, dated Feb. 11, 2018.
Chinese Office Action and Search Report for Application No. 2012105991938 dated Mar. 30, 2016, and its English translation thereof.
English translation of Chinese Office Action for Application No. 2012105991938 dated Dec. 12, 2016.
English Translation of Chinese Office Action for Application No. 2012105991938, dated Jun. 8, 2017.
English Translation of Chinese Office Action for Application No. 2012105991938, dated Dec. 6, 2017.
English Translation of the Chinese Notification of Reexamination for Application No. 201210599193.8 dated Sep. 29, 2018.
Notification of Reexamination for Chinese App. No. 201210599167.5 dated Dec. 19, 2018, and its English translation thereof.

* cited by examiner

COOLING SYSTEM FOR HIGH DENSITY HEAT LOADS

CROSS REFERENCE TO RELATED APPLICATIONS

This application is a divisional of U.S. application Ser. No. 13/723,661, filed on Dec. 21, 2012, which claims the benefit of U.S. Provisional Application No. 61/580,686 filed on Dec. 28, 2011. The entire disclosures of each of the above applications are incorporated herein by reference.

FIELD

The present disclosure relates to pumped refrigerant cooling systems for precision cooling applications having 1+1 to N+1 primary cooling circuit redundancy.

BACKGROUND

This section provides background information related to the present disclosure which is not necessarily prior art.

A data center is a room containing a collection of electronic equipment, such as computer servers. Data centers and the equipment contained therein typically have optimal environmental operating conditions, temperature and humidity in particular. A climate control system maintains the proper temperature and humidity in the data center.

The climate control system includes a cooling system that cools air and provides the cooled air to the data center. The cooling system may include air conditioning units, such as computer room air conditioning unit (CRAC) or computer room air handlers (CRAH) that cools the air that is provided to the data center. The data center may have a raised floor and the cooled air introduced into the data center through vents in the raised floor. The raised floor may be constructed to provide a plenum between the cold air outlet of the CRAC (or CRACs) or CRAH (or CRAHS) and the vents in the raised floor, or a separate plenum such as a duct may be used.

The data center could also have a hard floor. The CRACS may, for example, be arranged in the rows of the electronic equipment, may be disposed with their cool air supply facing respective cold aisles, or be disposed along walls of the data center. The equipment racks in the data center may be arranged in a hot aisle/cold aisle configuration with the equipment racks arranged in rows. The cold air inlets of the racks, typically at the front of the racks, in one row face the cold air inlets of the racks in a row across a cold aisle, and the hot air outlets of the racks in one row face the hot air outlets of the racks in a row across a hot aisle.

One type of cooling system uses a pumped refrigerant cooling unit, such as the cooling units used in the XD System available from Liebert Corporation of Columbus, Ohio. The Liebert XD System has two cooling loops, that may also be referred to as cooling circuits or cycles. A primary loop uses chilled water or a refrigerant, such as R407C and a secondary loop uses a pumped refrigerant, such as R134a. The primary loop includes a fluid to fluid heat exchanger to cool the pumped refrigerant circulating in the secondary loop. The secondary loop includes one or more phase change cooling modules having a fluid to air heat exchanger through which the pumped refrigerant is circulated to cool air flowing across the heat exchanger.

Basic schematics for the two cooling loops (or cycles) of the Liebert XD System are shown and described in U.S. Ser. No. 10/904,889 for "Cooling System for High Density Heat Load," the entire disclosure of which is incorporated herein by reference. FIGS. 1 and 2 of this application are included herein as FIGS. 1 and 2 along with the accompanying description from this application.

Referring to FIGS. 1 and 2, the disclosed cooling system 10 includes a first cooling cycle 12 (the primary cooling loop) in thermal communication with a second cycle 14 (the secondary cooling loop). The disclosed cooling system 10 also includes a control system 90. Both the first and second cycles 12 and 14 include independent working fluids. The working fluid in the second cycle is any volatile fluid suitable for use as a conventional refrigerant, including but not limited to chlorofluorocarbons (CFCs), hydro fluorocarbons (HFCs), or hydrochloro-fluorocarbons (HCFCs). Use of a volatile working fluid eliminates using water located near sensitive equipment, as is sometimes done in conventional systems for cooling computer rooms. The second cycle 14 includes a pump 20, one or more first heat exchangers (evaporators) 30, a second heat exchanger 40, and piping to interconnect the various components of the second cycle 14. The second cycle 14 is not a vapor compression refrigeration system. Instead, the second cycle 14 uses the pump 20 instead of a compressor to circulate a volatile working fluid for removing heat from a heat load. The pump 20 is preferably capable of pumping the volatile working fluid throughout the second cooling cycle 14 and is preferably controlled by the control system implemented by controller 90.

The first heat exchanger 30 is an air-to-fluid heat exchanger that removes heat from the heat load (not shown) to the second working fluid as the second working fluid passes through the second fluid path in first heat exchanger 30. For example, the air-to-fluid heat exchanger 30 can include a plurality of tubes for the working fluid arranged to allow warm air to pass therebetween. It will be appreciated that a number of air-to-fluid heat exchangers known in the art can be used with the disclosed cooling system 10. A flow regulator 32 can be connected between the piping 22 and the inlet of the evaporator 30 to regulate the flow of working fluid into the evaporator 30. The flow regulator 32 can be a solenoid valve or other type of device for regulating flow in the cooling system 10. The flow regulator 32 preferably maintains a constant output flow independent of the inlet pressure over the operating pressure range of the system. In the embodiment of FIGS. 1 and 2, the second cycle 14 includes a plurality of evaporators 30 and flow regulators 32 connected to the piping 22. However, the disclosed system can have one or more than one evaporator 30 and flow regulators 32 connected to the piping 22.

The second heat exchanger 40 is a fluid-to-fluid heat exchanger that transfers heat from the second working fluid to the first cycle 12. It will be appreciated that a number of fluid-to-fluid heat exchangers known in the art can be used with the disclosed cooling system 10. For example, the fluid-to-fluid heat exchanger 40 can include a plurality of tubes for one fluid positioned in a chamber or shell containing a second fluid. A coaxial ("tube-in-tube") exchanger would also be suitable. In certain embodiments, it is preferred to use a plate heat exchanger. The second cycle 14 can also include a receiver 50 connected to the outlet piping 46 of the second heat exchanger 40 by a receiver output line 52. The receiver 50 may store and accumulate the working fluid in the second cycle 14 to allow for changes in the temperature and heat load.

In one embodiment, the air-to-fluid heat exchanger 30 can be used to cool a room holding computer equipment. For example, a fan 34 can draw air from the room (heat load)

through the heat exchanger 30 where the second working fluid absorbs heat from the air. In another embodiment, the air-to-fluid heat exchanger 30 can be used to directly remove heat from electronic equipment (heat load) that generates the heat by mounting the heat exchanger 30 on or close to the equipment. For example, electronic equipment is typically contained in an enclosure (not shown). The heat exchanger 30 can mount to the enclosure, and fans 34 can draw air from the enclosure through the heat exchanger 30. The first heat exchanger 30 could be an alternate type of heat exchanger (e.g., a cold plate), and may be in direct thermal contact with the heat source. It will be appreciated by those skilled in the art that the heat transfer rates, sizes, and other design variables of the components of the disclosed cooling system 10 depend on the size of the disclosed cooling system 10, the magnitude of the heat load to be managed, and on other details of the particular implementation.

In the embodiment of the disclosed cooling system 10 depicted in FIG. 1, the first cycle 12 includes a chilled water cycle 60 connected to the fluid-to-fluid heat exchanger 40 of the second cycle 14. In particular, the second heat exchanger 40 has first and second portions or fluid paths 42 and 44 in thermal communication with one another. The second fluid path 42 for the volatile working fluid is connected between the first heat exchanger 30 and the pump 20. The first fluid path 44 is connected to the chilled water cycle 60. The chilled water cycle 60 may be similar to those known in the art. The chilled water system 60 includes a first working fluid that absorbs heat from the second working fluid passing through the fluid-to-fluid heat exchanger 40. The first working fluid is then chilled by techniques known in the art for a conventional chilled water cycle. In general, the first working fluid can be either volatile or non-volatile. For example, in the embodiment of FIG. 1, the first working fluid can be water, glycol, or mixtures thereof. Therefore, the embodiment of the second cycle 14 in FIG. 1 can be constructed to include the pump 20, air-to-fluid heat exchanger 30, and fluid-to-fluid heat exchanger 40 and can be connected to an existing chilled water service that is available in the building housing the equipment to be cooled, for example.

In the embodiment of the disclosed cooling system 10 in FIG. 2, the second cycle 14 is substantially the same as that described above. However, the first cycle 12 includes a vapor compression refrigeration system 70 connected to the first portion or fluid path 44 of heat exchanger 40 of the second cycle 14. Instead of using chilled water to remove the heat from the second cycle 14 as in the embodiment of FIG. 1, the refrigeration system 70 in FIG. 2 is directly connected to or is the "other half" of the fluid-to-fluid heat exchanger 40. The vapor compression refrigeration system 70 can be substantially similar to those known in the art. An exemplary vapor compression refrigeration system 70 includes a compressor 74, a condenser 76, and an expansion device 78. Piping 72 connects these components to one another and to the first fluid path 44 of the heat exchanger 40.

The vapor compression refrigeration system 70 removes heat from the second working fluid passing through the second heat exchanger 40 by absorbing heat from the exchanger 40 with a first working fluid and expelling that heat to the environment (not shown). For example, in the embodiment of FIG. 2, the first working fluid can be any conventional chemical refrigerant, including but not limited to chlorofluorocarbons (CFCs), hydrofluorocarbons (HFCs), or hydrochloro-fluorocarbons (HCFCs). The expansion device 78 can be a valve, orifice or other apparatus known to those skilled in the art to produce a pressure drop in the working fluid passing therethrough. The compressor 74 can be any type of compressor known in the art to be suitable for refrigerant service such as reciprocating compressors, scroll compressors, or the like. In the embodiment depicted in FIG. 2, the cooling system 10 is self-contained. For example, the vapor compression refrigeration system 70 can be part of a single unit that also houses pump 20 and fluid-to-fluid heat exchanger 30.

During operation of the disclosed system, pump 20 moves the working fluid via piping 22 to the air-to-fluid heat exchanger 30. Pumping increases the pressure of the working fluid, while its enthalpy remains substantially the same. The pumped working fluid then enters the air-to-fluid heat exchanger or evaporator 30 of the second cycle 14 after passing through flow regulator 32. A fan 34 can draw air from the heat load through the heat exchanger 30. As the warm air from the heat load (not shown) enters the air-to-fluid heat exchanger 30, the volatile working fluid absorbs the heat. As the fluid warms through the heat exchanger, some of the volatile working fluid will evaporate. In a fully loaded cooling system 10, the fluid leaving the first heat exchanger 30 will be substantially vapor. The vapor flows from the heat exchanger 30 through the piping 36 to the fluid-to-fluid heat exchanger 40. In the return line or piping 36, the working fluid is substantially vapor, and the pressure of the fluid drops while its enthalpy remains substantially constant. At the fluid-to-fluid heat exchanger 40, the vapor in the second fluid path 42 is condensed by transferring heat to the first, colder fluid of the first cycle 12 in the first fluid path 44. The condensed working fluid leaves the heat exchanger 40 via piping 46 and enters the pump 20, where the second cycle 14 can be repeated.

The first cooling cycle 12 operates in conjunction with second cycle 14 to remove heat from the second cycle 14 by absorbing the heat from the second working fluid into the first working fluid and rejecting the heat to the environment (not shown). As noted above, the first cycle 12 can include a chilled water system 60 as shown in FIG. 1 or a vapor compression refrigeration system 70 as shown in FIG. 2. During operation of chilled water system 60 in FIG. 1, for example, a first working fluid can flow through the first fluid path 44 of heat exchanger 40 and can be cooled in a cooling tower (not shown). During operation of refrigeration system 70 in FIG. 2, for example, the first working fluid passes through the first portion 44 of fluid-to-fluid heat exchanger 40 and absorbs heat from the volatile fluid in the second cycle 14. The working fluid evaporates in the process. The vapor travels to the compressor 74 where the working fluid is compressed. The compressor 74 can be a reciprocating, scroll or other type of compressor known in the art. After compression, the working fluid travels through a discharge line to the condenser 76, where heat from the working fluid is dissipated to an external heat sink, e.g., the outdoor environment. Upon leaving condenser 76, refrigerant flows through a liquid line to expansion device 78. As the refrigerant passes through the expansion device 78, the first working fluid experiences a pressure drop. Upon leaving expansion device 78, the working fluid flows through the first fluid path of fluid-to-fluid heat exchanger 40, which acts as an evaporator for the refrigeration system 70.

Data center providers are continually seeking increased reliability and up time from climate control systems. Therefore, data center providers continually desire improved redundancy in the climate control systems to guard against unnecessary down time of the cooled electronic equipment due to unexpected interruption in operation of the climate control systems. One mode of redundancy is to replicate each element of a cooling system, such as the first cooling cycle 12 and the second cooling cycle 14. Such complete redundancy can be prohibitively expensive and greatly complicates the design, implementation, and control of the cooling systems. In various configurations, redundancy may include implementation of a cooling loop, including a second, reduced implementation of a second cooling cycle 14 such as shown in FIGS. 1 and 2. The reduced redundancy could include a second pump unit 20 and half of the heat exchangers provided in the primary cooling system. Implementing this redundant system would also require the associated plumbing and controls. Accordingly, an approximate cost of such a system could be in the range of 50% of the total cost of the base cooling load.

Another approach to redundancy in order to minimize equipment can include over-provisioning the environment by deploying cooling modules in complicated, interweaved schemes. Failure of one cooling loop can then be covered by other cooling loops interwoven into the zone of the failed one cooling loop. Such over provisioning again provides increased cost to the consumer which includes extra pumps, cooling modules, plumbing, piping and control systems over conventional configurations shown in FIGS. 1 and 2.

SUMMARY

This section provides a general summary of the disclosure, and is not a comprehensive disclosure of its full scope or all of its features.

A cooling system having a plurality of pumping units to supply cooling fluid to a load. In various configurations, the pumping units supply a portion of the cooling fluid to the load. If a pumping unit experiences a fault condition, the output of the other pumping unit is increased to maintain sufficient fluid flow to the load. In other configurations, an additional pumping unit is provided which does not normally supply fluid flow to the load. When one of the other pumping units experiences a fault condition, the additional pumping unit is activated to provide fluid flow to the load. In other configurations, a plurality of pumping units provides fluid flow to a plurality of respective loads. When one of the pumping units experiences a fault condition, a redundant pumping unit is inserted into the circuit to supply fluid flow to the load associated with the fault condition pumping unit.

A cooling system includes a first cooling module, the cooling module having a first variable speed pump circulating refrigerant through a load. The cooling system also has a second cooling module, the second cooling module having a second variable speed pump circulating refrigerant through the load. The first and second variable speed pumps operate at less than full speed. When one of the first cooling module or the second cooling modules cannot sufficiently circulate refrigerant through the load, the speed of the variable speed pump of another of the first or second cooling modules is increased to compensate for the one cooling module.

A cooling system includes a plurality of cooling modules supplying refrigerant to a load, a plurality of cooling modules each has a variable speed pump for supplying the refrigerant to the load. The variable speed pumps operate at less than full speed. When one of the plurality of cooling modules cannot sufficiently supply refrigerant, a speed of the variable speed pump of at least one of another of the plurality of cooling modules having a variable speed that is increased to compensate for the one of the plurality of cooling modules.

A method for providing redundant cooling in a cooling system includes providing a plurality of cooling modules. The plurality of cooling modules cooperate to pump cooling fluid to at least one thermal load. The cooling modules operating at variable speeds. The speed of one of the plurality of cooling modules is increased when another of the plurality of cooling modules experiences a decrease in speed. The speed of the one of the plurality of cooling modules is decreased when another of the plurality of cooling modules experiences an increase in speed.

A method for providing redundant cooling module in a cooling system includes providing a first cooling module. The first cooling module provides cooling fluid to a thermal load. The first cooling module operates at variable speeds. The first cooling module has a first normal operating speed, the first normal operating speed being less than a full speed. Providing a second cooling module. The second cooling module provides cooling fluid to the thermal load. The second cooling module operates at variable speeds, the second cooling module having a second normal operating speed, the second normal operating speed being less than a full speed. Increasing the speed of one of the first cooling module or second cooling module when the other of the first cooling module or second cooling module is operating at a speed less than its respective normal operating speed. Decreasing the speed of the first cooling module or second cooling module when the other of the first cooling module or second cooling module experiences an increase in speed.

A cooling system including: a primary cooling module. The primary cooling module supplying refrigerant to a load. A secondary cooling module provides a supplemental flow of refrigerant to the load upon detection of a deficiency of the primary cooling module.

A cooling system including: a plurality of primary cooling modules. The primary cooling modules supply refrigerant to a respective one of a plurality of thermal loads. A secondary cooling module selectively provides a supplemental flow of refrigerant through the load associated with a primary cooling module for which a fault has been detected.

A method for providing redundant cooling in a cooling system includes providing a primary cooling module having a circuit. The primary cooling module provides cooling fluid to a thermal load. Providing a secondary cooling module, and initiating operation of the secondary cooling module upon detection of a fault in the primary cooling module. Inserting the secondary cooling module into the circuit, the secondary cooling module providing cooling fluid to the thermal load, and deactivating the primary cooling module.

A method for providing redundant control of a cooling system includes providing a plurality of primary cooling modules. The primary cooling modules circulates refrigerant through a respective thermal load. Providing a secondary cooling module. The secondary cooling module selectively provides a supplemental flow of refrigerant through the load associated with a selected primary cooling module when a fault is detected in one of the primary cooling modules.

DRAWINGS

The drawings described herein are for illustrative purposes only of selected embodiments and not all possible implementations, and are not intended to limit the scope of the present disclosure.

Figure 6:
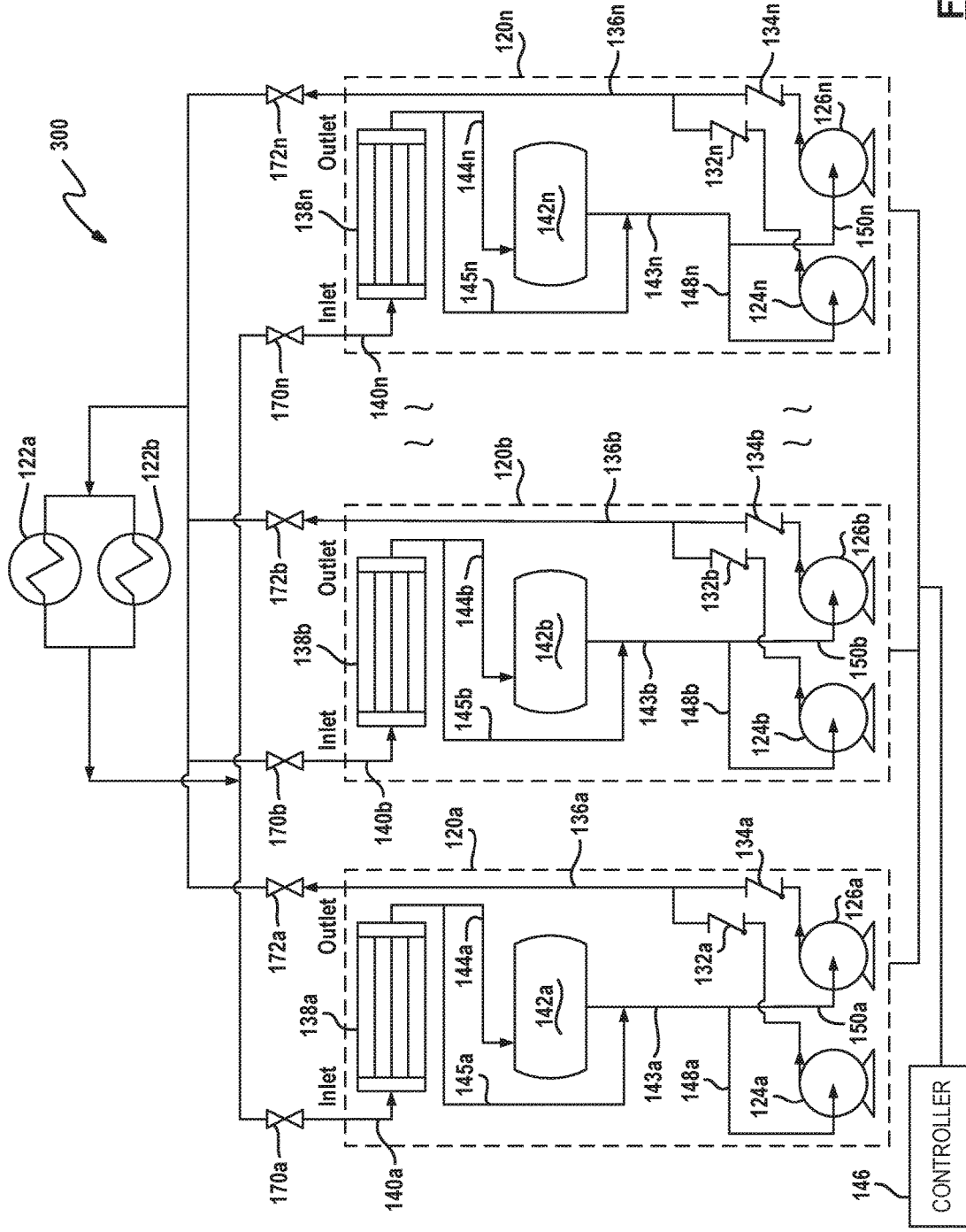
Figure 7:
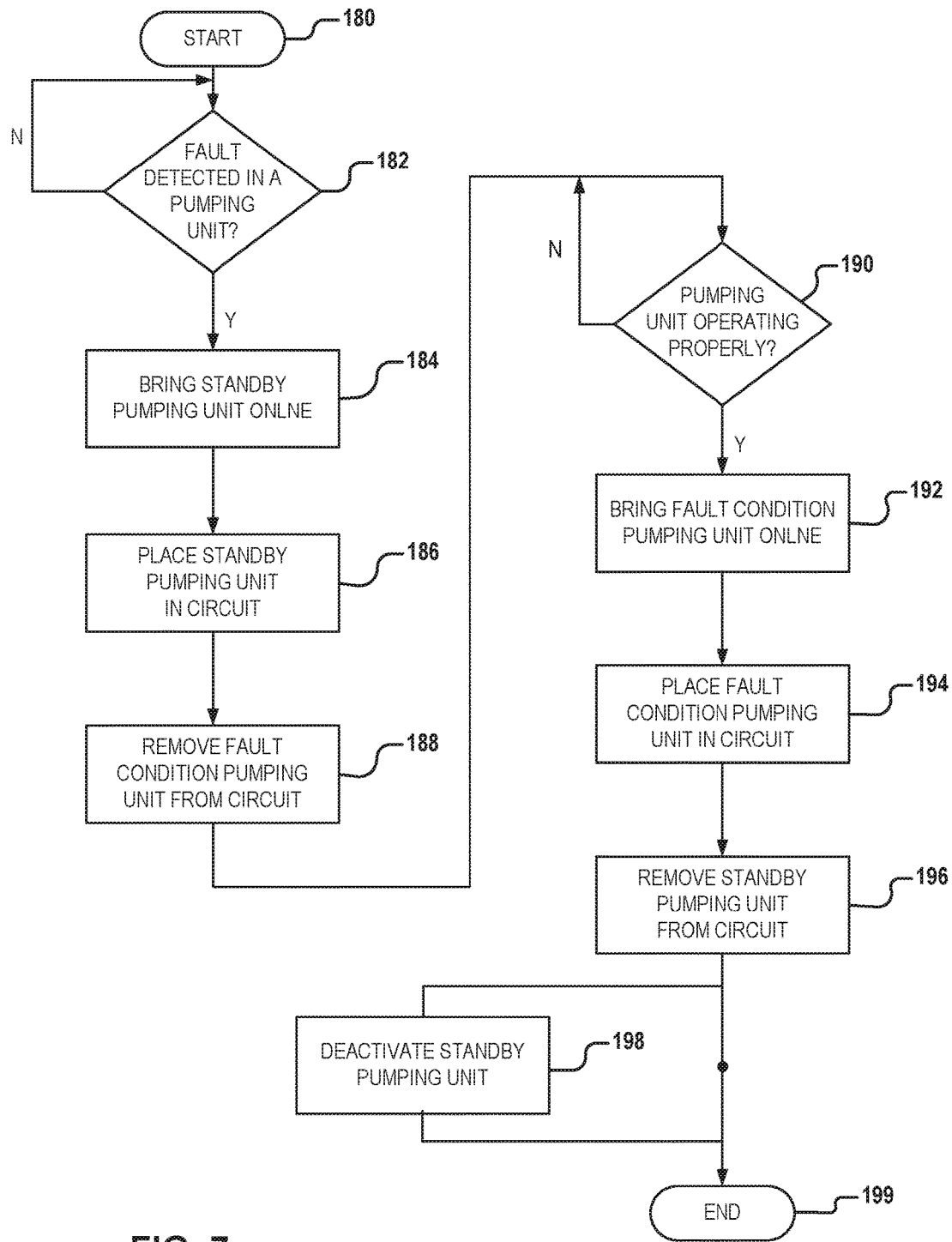
Figure 8:
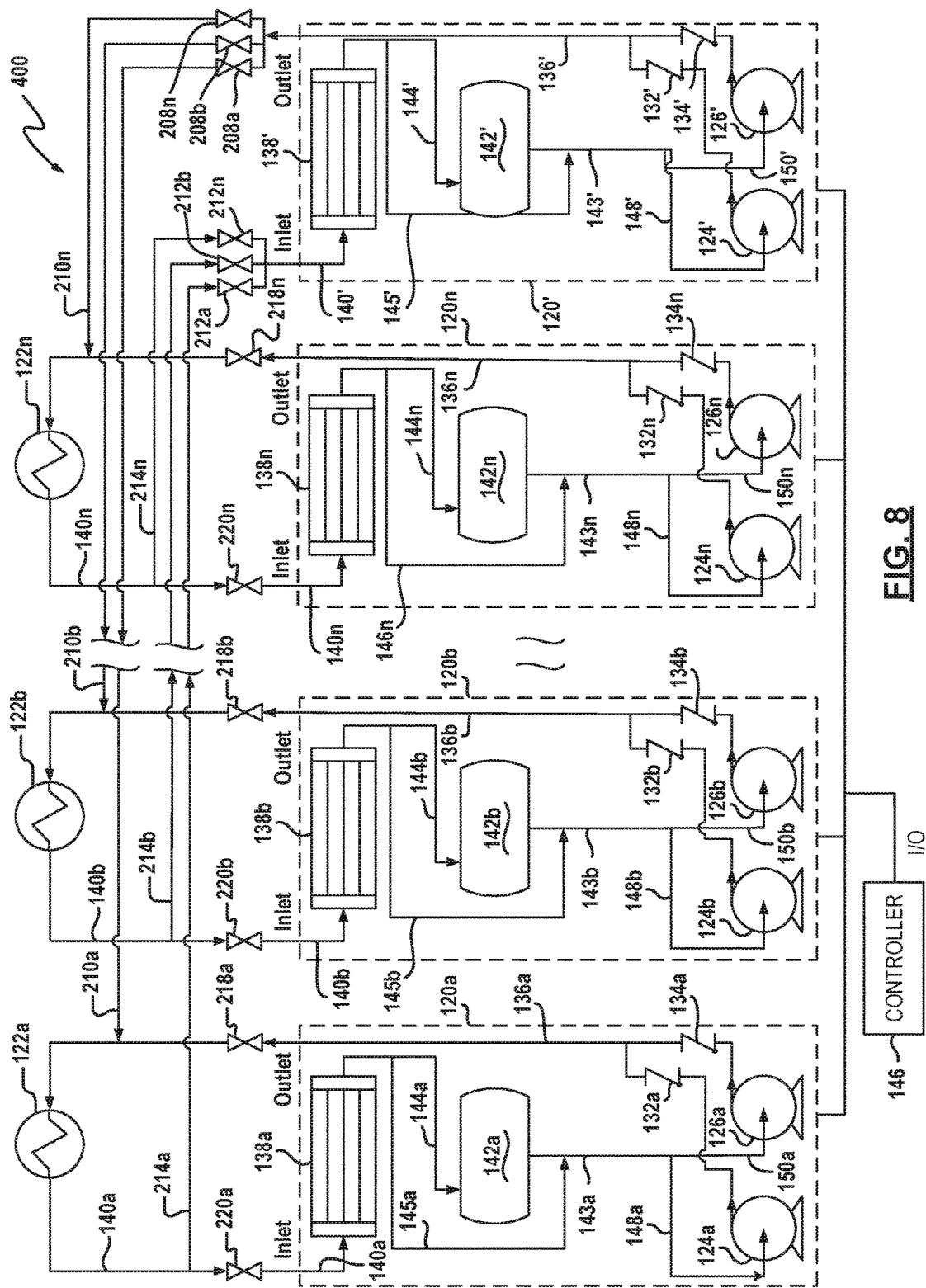
Figure 9:
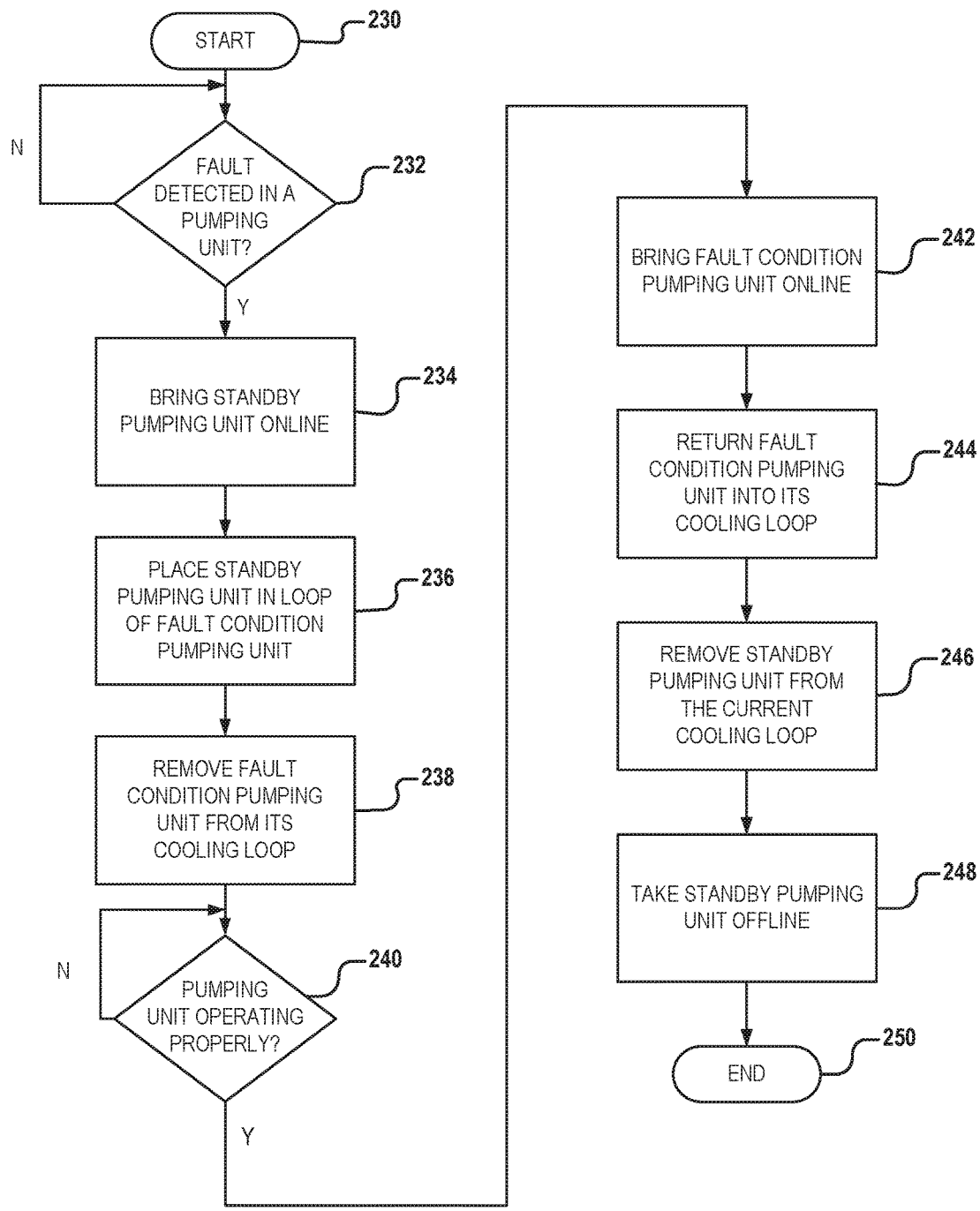

FIG. 6. is a schematic view of a cooling system arranged according to another various embodiment;

FIG. 7 is a flow diagram depicting a process for providing redundant cooling in the system of FIG. 6;

FIG. 8 is a schematic view of a cooling system arranged according to another various embodiment; and FIG. 9 is a flow diagram depicting a process for providing redundant cooling in the system of FIG. 9.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 3:
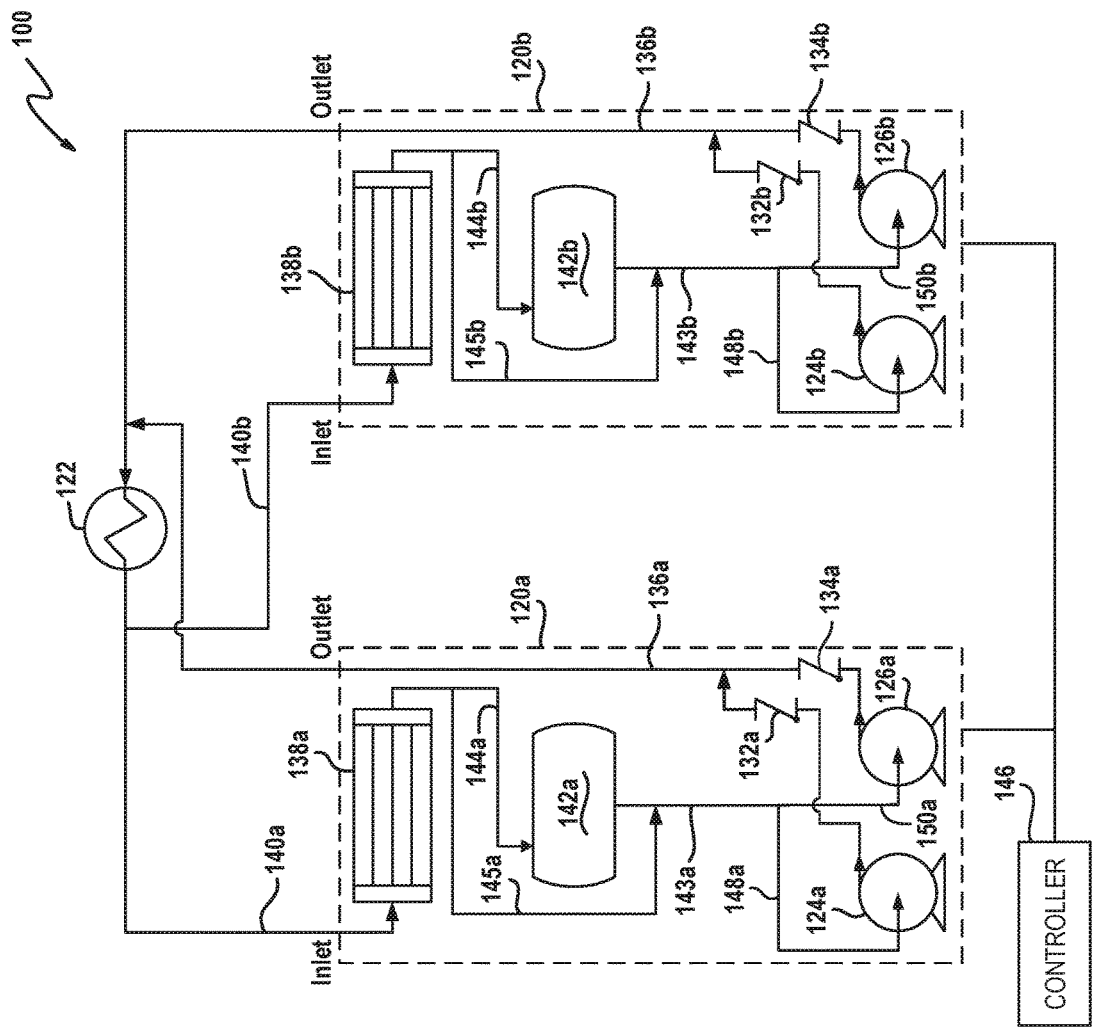
FIG. 3 is a schematic view of a cooling system arranged according to various embodiments.

FIG. 3 depicts a schematic view of a pumped refrigerant cooling system 100 arranged in accordance with various embodiments. The pumped refrigerant cooling system 100 includes a pair of pumping units 120a, 120b. Pumping units 120a, 120b provide a working fluid pumped to a load 122. Load 122 is placed in an environment to cool, such as a data room. In some instances, n elements may be described collectively using the reference numeral without the a, b, . . . , n. Further, like reference numerals will be used to describe similar elements throughout the specification. In various configurations, load 122 can include a plurality of loads 122, referred to collectively as load 122.

Each pumping unit 120 includes a first pump 124 and a second pump 126 which pump the working fluid at an elevated pressure to respective check valves 132, 134. Pumps 124, 126 can be arranged in a first, redundant configuration. Alternatively, pumps 124, 126 can be arranged to cooperatively apply fluid at an output pressure and fluid flow through respective check valves 132, 134 to output line 136. Pumps 124, 126 can be controlled to provide both redundant and cooperative operation.

Figure 1:
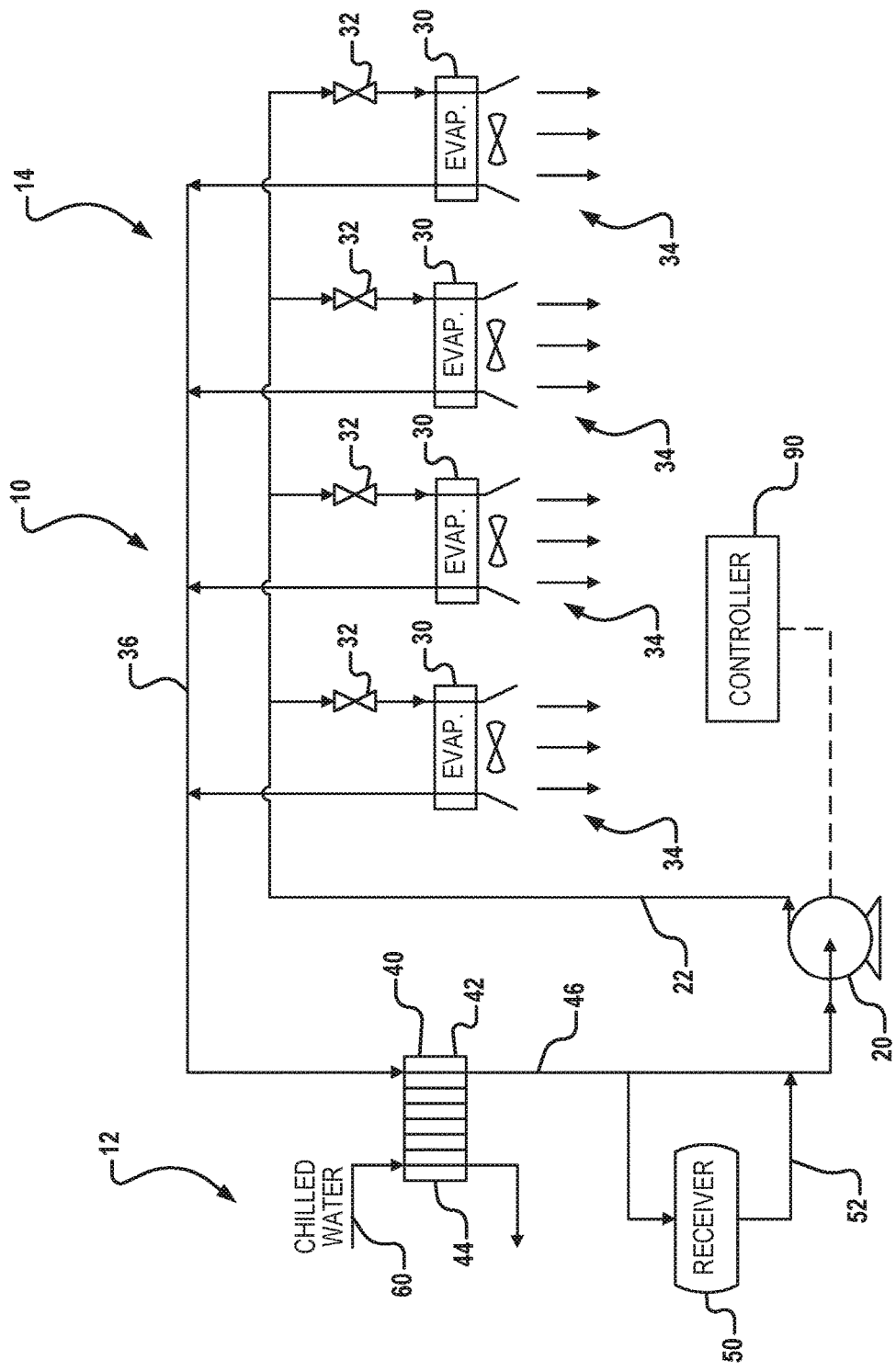
FIG. 1 is a schematic view of a primary cooling loop connected to a chilled water cycle.
Figure 2:
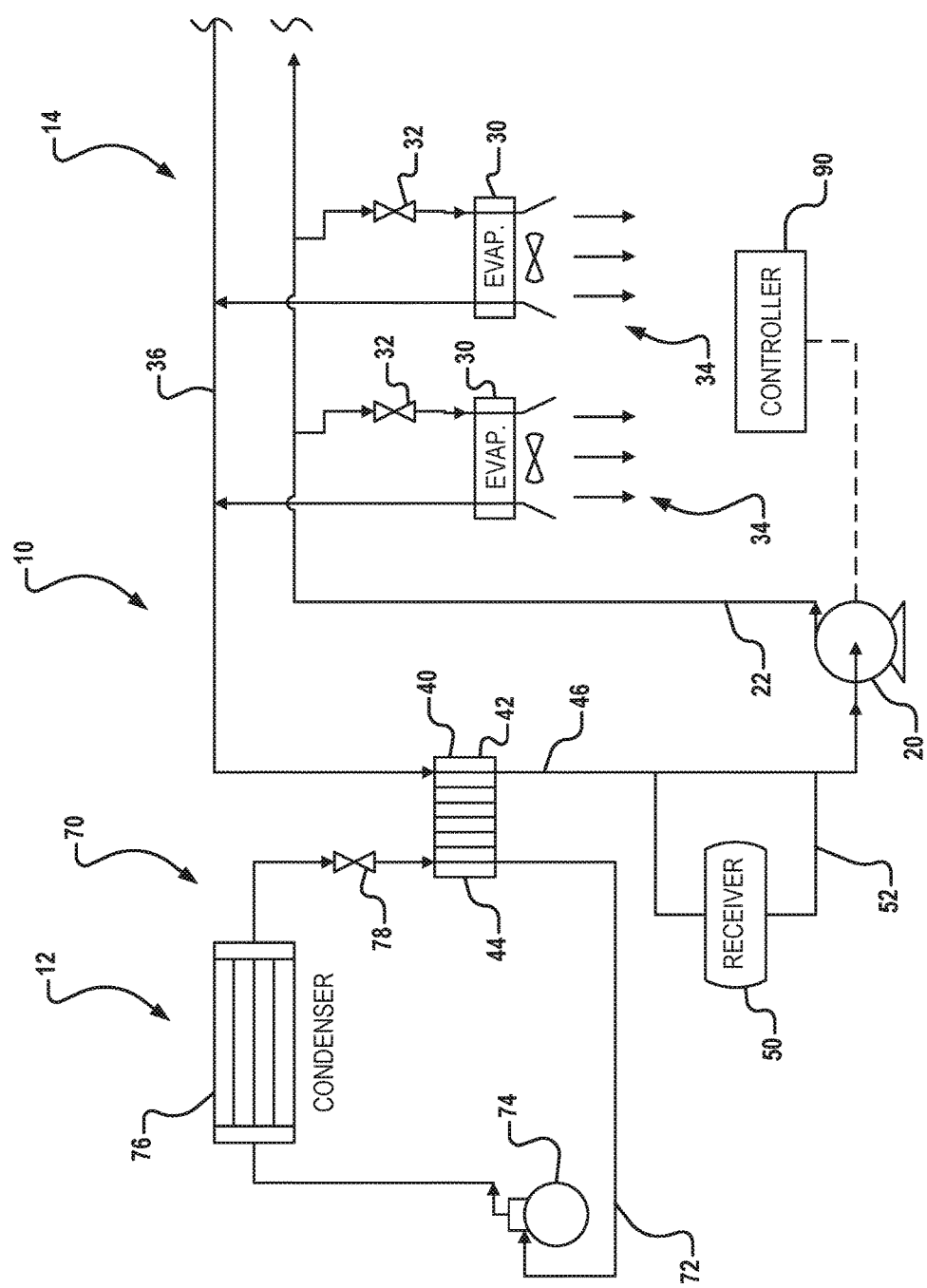
FIG. 2 is a schematic view of a cooling system having a primary cooling loop utilizing a vapor compression refrigeration system.

Fluid pumped through output line 136 is applied to load 122. Load 122 may assume a number of configurations, including a configuration similar to evaporator 30 of FIGS. 1 and 2. Load 122 is placed in an environment where it is desirable to remove heat from the environment in which load 122 is situated by transferring the heat to fluid pumped through output line 136. Fluid from output line 136 enters load 122 at a first temperature and exits load 122 on line 140 at an elevated temperature. Fluid pumped through load 122 may also change phase from a liquid phase to a gaseous phase. Line 140, generally referred to as inlet line 140, returns the working fluid to pumping unit 120.

Fluid in inlet line 140 is input to condenser 138. Condenser 138 receives the working fluid at a first, elevated temperature and rejects the heat in the working fluid to output fluid at a reduced temperature. Fluid passing through condenser 138 changes phase from a gaseous to a liquid phase. The fluid output at a reduced temperature is output through return line 144 which is input to receiver 142. Receiver 142 stores working fluid for use by pumping unit 120. Receiver 142 returns working fluid to respective pumps 124, 126 via receiver output line 143. A bypass line 145 bypasses receiver enabling fluid to pass from the outlet of condenser 138 directly to receiver output line 143, bypassing receiver 142. Receiver output line 143 provides working fluid to pumps 124, 126 via respective pump input lines 148, 150. A controller 146 connects to each pumping unit 120, and sends and receives sense and control signals to and from each main pumping unit 120.

In operation, respective pumping units 120a, 120b each provide approximately 50% of the required refrigerant flow to load 122. When a scenario occurs that either of pumping units 120a or 120b provides less than the predetermined capacity, such as 50%, the other pumping unit 120a, 120b can be controlled by controller 146 to increase the output. The output may be increased by increasing the output of the other pump unit 120a, 120b to maintain sufficient fluid flow to load 122. When it is determined that the pumping unit previously determined to be providing less than full capacity is fully back online, the output of each pumping unit 120a, 120b can be returned to a predetermined operation, such as 50% of full load.

Figure 4:
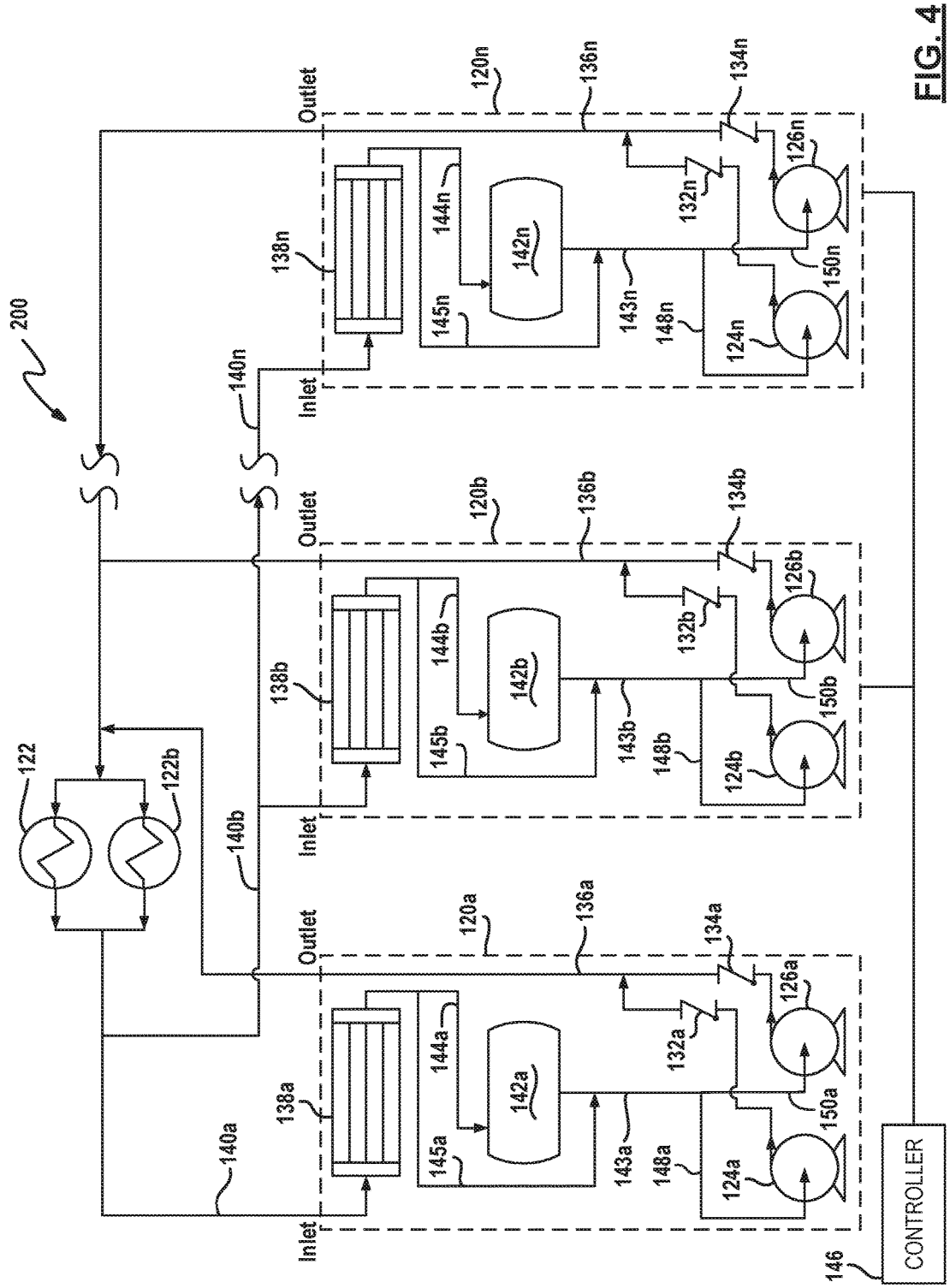
FIG. 4 is a schematic view of a cooling system arranged according to various embodiments.

FIG. 4 depicts a schematic view of a pumped refrigerant cooling system 200 arranged in accordance with various embodiments. FIG. 4 is arranged similarly to FIG. 3 described above, but includes more than two pumping units 120. The pumped refrigerant cooling system 200 includes a plurality of primary pumping units 120a, 120b, . . . , 120n. Each pumping unit 120a, 120b, . . . , 120n provides a working fluid pumped to load 122 or a plurality of loads 122 arranged in parallel. Load 122 is placed in an environment to be cooled, such as a data room. It should be noted that n can be any positive integer and represents a selected number of similarly arranged elements in the figures. For example, pumping units 120a, 120b, . . . , 120n refer to N pumping units. The number of pumping units can be varied depending on the particular implementation of the pumped refrigerant cooling system 200 described herein. This numbering convention will be used to describe other similar units. In some instances, the n pumping units may be described collectively using the reference numeral without the a, b, . . . , n.

Operation of the pumped refrigerant cooling systems 100, 200 of FIGS. 3 and 4 will be described. Pumped refrigerant cooling system 200 of FIG. 4 operates similarly to the pumped refrigerant cooling system 100 of FIG. 3. Particularly, pumped refrigerant cooling system 200 operates similarly except that it has multiple pumping units 120 rather than the pair of pumping units 120 described in connection with FIG. 3.

In operation, pumping units 120 operate at less than full capacity to share a portion of the fluid flow provided to load 122. In various configurations the distribution may be equal. In other configurations, the distribution need not be equal. When any of the N pumping units is disabled by controller 146, a controller 146 also increases the output of the remaining (N-1) pumping units 120 to load 122 to maintain sufficient refrigerant flow through load 122. By way of non-limiting example, if N=3, and the refrigerant flow is divided equally among the three pumping units 120, each pumping unit applies 33.33% of the overall refrigerant flow to load 122. If any one of the N units should be deactivated by controller 146, the remaining (N-1) units provide the remaining refrigerant flow to load 122. In this instance, each of the remaining (N-1) units will provide approximately 50% of the total refrigerant flow to load 122. In another non-limiting example, if N=5, each of the primary pumping units 120 may provide 20% of the total refrigerant flow to load 122. If controller 146 deactivates one of the pumping units 120, the remaining four pumping units provide 25% of the overall refrigerant flow. While the examples described herein are directed to each pumping unit 120 providing equal refrigerant flow, one skilled in the art would recognize that the pumping units 120 could provide unequal flow so long as the pumping units 120 remaining online can provide sufficient refrigerant flow to load 122.

Figure 5:
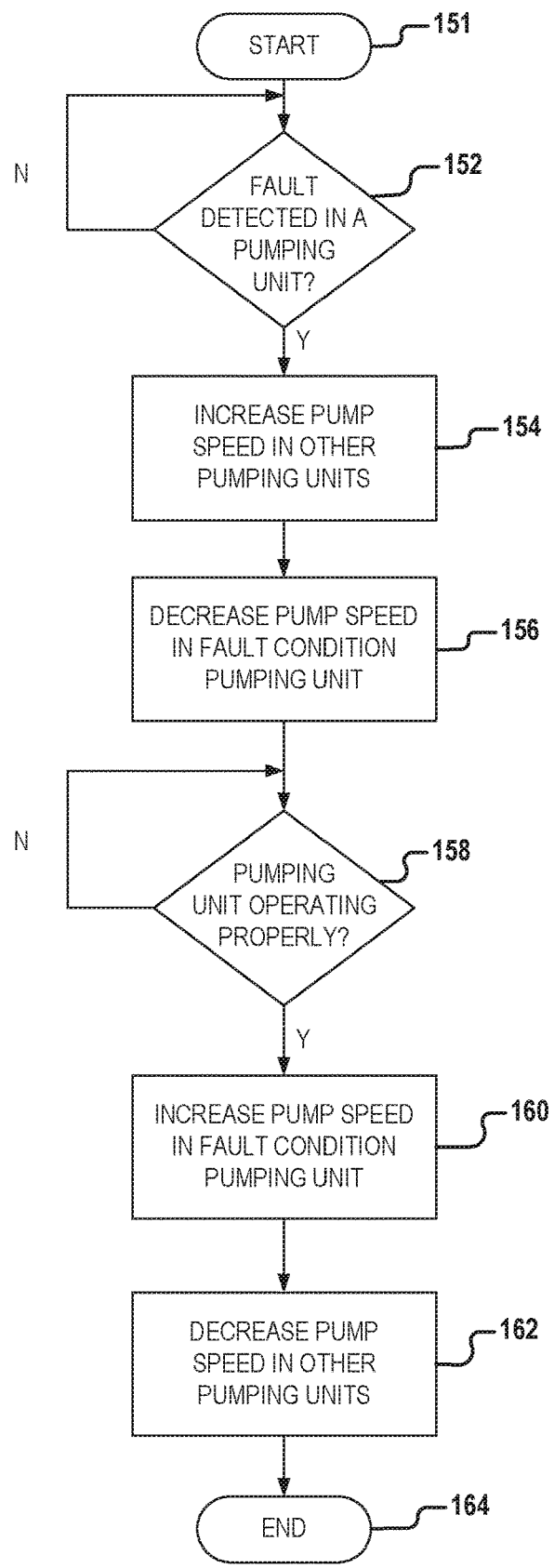
FIG. 5 is a flow diagram depicting a process for providing redundant cooling capacity in a system having a redundant cooling source, such as FIGS. 3 and 4.

FIG. 5 depicts a block diagram for providing redundancy of the pumping units in the pumped refrigerant cooling system of FIGS. 3 and 4. The process begins at start block 151 and proceeds to decision block 152. Decision block 152 determines if a fault has been detected in one of the pumping units 120. If no fault has been detected, control proceeds back to the beginning of decision block 152 which continues to monitor whether a fault condition has been detected in a pumping unit. If a fault condition has been detected in a pumping unit, control proceeds to block 154 where controller 146 provides a signal to increase the speed of the (N-1) pumping units other than the fault condition pumping unit. Once the output of the remaining (N-1) pumping units 120 has been sufficiently increased, control proceeds to block 156. At block 156, controller 146 adjusts the output of pumping unit 120 fault condition pumping unit 120. Controller 146 can either decrease the requested output of the fault condition pumping unit 120 or deactivate the fault condition pumping unit 120. Control then proceeds to block 158 which monitors for an indication that the fault condition pumping unit 120 has returned to normal operation. If the fault condition pumping unit has not returned to normal operation, control proceeds back to the beginning of decision block 158. When the fault condition pumping unit is determined to be operating properly, control proceeds to block 160. At block 160, controller 146 generates control signals to restore fault condition pumping unit 120 previously to its normal operation output. Control then proceeds to block 162. At block 162, controller 146 decreases the speed of the (N-1) pumping units 120 whose speed was previously increased in order to compensate for the prior deactivation or reduction of output of the fault condition pumping unit 120. Control then proceeds to block 164 where the process is completed.

FIG. 6. depicts a cooling system 300 arranged in accordance with various embodiments. The cooling system 300 includes pumping units 120a, 120b, . . . , 120n which are arranged similarly to pumping units 120 described previously herein. Pumping units 120 provide fluid flow to a pair of cooling modules or loads 122a, 122b shown arranged in parallel. The configuration of FIG. 6 is directed to a system including a pumping unit operating as a standby pumping unit that is activated when one or more of the other (N-1) pumping units must be deactivated. The standby pumping unit 120 then becomes activated and inserted into the circuit while the other pumping unit is deactivated by the controller 146.

FIG. 6 is arranged similarly to the various embodiments described above. FIG. 6 also includes inlet valves 170a, 170b, . . . , 170n associated with respective pumping units 120a, 120b, . . . , 120n. FIG. 6 also includes outlet valves 172a, 172b, 172n associated with respective pumping units 120a, 120b, . . . , 120n. Inlet valves 170 and outlet valves 172 cooperate to enable and disable fluid flow to and from respective pumping units 120. Pumping unit 120n of the N pumping units function as a standby pumping unit and is activated to provide fluid flow replacing the fluid flow of one or more of the other (N-1) pumping units 120 when deactivated.

FIG. 7 depicts a block diagram of the operation of the pumped refrigerant cooling system 300 of FIG. 6. Control begins at start block 180 and proceeds to decision block 182. At decision block 182 the controller 146, or other portion of the system 300, determines whether a fault condition has been detected in a pumping unit 120. If no fault has been detected, control proceeds back to decision block 182. If a fault has been detected, control proceeds to block 184. At block 184, controller 146 brings the standby pumping unit, 120n in this example, online so that standby pumping unit 120n can provide pressurized fluid flow. Control then proceeds to block 186 where controller 146 places the standby pumping unit 120n into the circuit by opening inlet valve 170n and outlet valve 172n. This enables standby pumping unit 120n to provide fluid flow to load 122. Control then proceeds to block 188 where the fault condition pumping unit 120 is removed from the circuit. Controller 146 removes the fault condition pumping unit 120 by closing its corresponding inlet valve 170 and outlet valve 172 in order to take the faulty pumping unit out of the circuit. Control next proceeds to decision block 190. At decision block 190, controller 146 determines whether the fault condition pumping unit is determined to be operating properly. If the deactivated pumping unit is not operating properly, control returns to decision block 190. If the fault condition pumping unit is determined to be operating properly. Control proceeds to block 192, and controller 146 brings the now properly operating pumping unit 120 back online so that it can provide fluid flow of cooling fluid to the loads 122. Once the fault condition pumping unit is brought online, control proceeds to block 194. At block 194, the fault condition pumping unit is placed into the circuit by opening its respective inlet valve 170 and outlet valve 172 to enable fluid flow to load 122. Control then proceeds to block 196. At block 196, controller 146 removes the standby pumping unit 120n from the circuit by closing inlet valve 170n and outlet valve 172n. Control then proceeds to block 198 in which controller 146 deactivates standby pumping units 120. Control then proceeds to end block 199.

FIG. 8 depicts a schematic view of a pumped refrigerant cooling system 400 having a redundant pumping unit. As described above, the pumped refrigerant cooling system 400 includes a plurality of main or primary pumping units 120a, 120b, . . . , 120n. Each primary pumping unit 120a, 120b, . . . , 120n provides a working fluid pumped to a load 122a, 122b, . . . , 122n. Each load 122a, 122b, . . . , 122n is placed in an environment to cool the environment, such as a data room. It should be noted that n can be any positive integer and represents a selected number of similarly arranged elements in the figures. For example, pumping units 120a, 120b, . . . , 120n refer to N pumping units. As also described above, one skilled in the art would recognize that the number of pumping units can be varied depending on the particular implementation of the pumped refrigerant cooling system 400 described herein.

Each main pumping unit 120 includes a first pump 124 and a second pump 126 which pump the working fluid at an elevated pressure to respective check valves 132, 134. Pumps 124, 126 can be arranged in a first, redundant configuration. Alternatively, pumps 124, 126 can be arranged to cooperatively apply fluid at an output pressure and fluid flow through respective check valves 132, 134 to output line 136. Pumps 124, 126 can be controlled to provide both redundant and cooperative operation.

Fluid pumped through output line 136 is applied to load 122. Load 122 may assume a number of configurations, including a configuration similar to evaporator 30 of FIGS. 1 and 2. Load 122 is placed in an environment where it is desirable to remove heat from the environment in which load 122 is situated by transferring the heat to fluid pumped through output line 136. Fluid from output line 136 enters load 122 at a first temperature and exits load 122 on line 140 at an elevated temperature. Fluid pumped through load 122 may also change phase from a liquid phase to a gaseous phase. Line 140, generally referred to as inlet line 140, returns the working fluid to main pumping unit 120.

Fluid in inlet line 140 is input to condenser 138. Condenser 138 receives the working fluid at a first, elevated temperature and rejects the heat in the working fluid to output fluid at a reduced temperature. Fluid passing through condenser 138 changes phase from a gaseous to a liquid phase. The fluid output at a reduced temperature is output through return line 144 which is input to receiver 142. Receiver 142 restores working fluid for use by pumping unit 120. Receiver 142 returns working fluid to respective pumps 124, 126 via receiver output line 143. A bypass line 145 bypasses receiver enabling fluid to pass from the outlet of condenser 138 directly to receiver output line 143, bypassing receiver 142. Receiver output line 143 provides working fluid to pumps 124, 126 via respective pump input lines 148, 150.

In addition to main pumping units 120a, 120b, . . . , 120n, a redundant or standby pumping unit 120' is included in the pumped refrigerant cooling system 400 of FIG. 8. Redundant pumping unit 120' provides working fluid at a pressure in the event that any of main pumping units 120a, 120b, . . . , 120n should become inactive. In this manner, pumping unit 120' provides redundancy to the other pumping units, thereby maintaining up-time and providing a cooling function for any of the loads 122 associated with the deactivated main pumping unit.

Redundant or standby pumping unit 120' is configured similarly to the above-described pumping unit 120. Pumping unit 120' also includes a standby liquid line 136' and a vapor line 140'. Fluid output from liquid standby line 136' can flow to each of loads 122a, 122b, . . . , 122n. Fluid flowing from liquid standby line 136' flows through one of standby outlet valves 208a, 208b, . . . , 208n. Standby liquid lines 210a, 210b, . . . , 210n connect to respective standby outlet valves 208a, 208b, . . . , 208n and deliver fluid in place of respective pumping units 120a, 120b, . . . , 120n. Respective outlet valves 218a, 218b, . . . , 218n can be closed to prevent fluid flow in standby liquid lines 210a, 210b, . . . , 210n from flowing into respective pumping units 120a, 120b, 120n. Vapor output from a load 122a, 122b, . . . , 122n can be returned to pumping unit 120' via respective standby vapor lines 214a, 214b, . . . , 214n. Standby vapor lines 214a, 214b, . . . , 214n connect to respective standby inlet valves 212a, 212b, . . . , 212n. Inlet valves 220a, 220b, . . . , 220n associated with a respective pumping unit 120a, 120b, . . . , 120n prevent vapor from flowing into selected respective pumping units 120a, 120b, . . . 120n. Controller 146 sends and receives monitoring and control signals to selected components of pumped refrigerant cooling system 400 in order to affect control of pump refrigerant cooling system 400.

Operation of the system of FIG. 8 will be described. When a main pumping unit 120 has become or must be deactivated because various operational conditions of a main pumping unit 120, redundant pumping unit 120' is activated to replace the deactivated main pumping unit. For example, if main pumping unit 120a requires deactivation, redundant pumping unit 120' would be activated to provide the pumping function for deactivated main pumping unit 120a. When this occurs, redundant pumping unit 120' is substituted into the cooling loop from load 122a to provide fluid flow to load 122a. This is accomplished through operation of valves 220a, 218a, 212a, and 208a.

For example, in order to insert redundant pumping unit 120' into the loop to provide fluid to load 122a, inlet valve 212a and outlet valve 208a are opened to allow fluid flow to and from pumping unit 120'. Similarly, inlet valve 220a and outlet valve 218b are closed in order to take pumping unit 120a out of the loop to provide fluid flow to load 122a. Once it is determined to reactivate main pumping unit 120a, thereby requiring deactivation of redundant pumping unit 120', a similar process to that described above occurs.

FIG. 9 depicts a block diagram of the operation of the pumped refrigerant cooling system 400 of FIG. 8. Control begins at start block 230 and proceeds to decision block 232. At decision block 232, controller 146, or other portion of the system, determines whether a fault condition has been detected in a pumping unit. If no fault condition has been detected, control proceeds back to decision block 232. If a fault condition has been detected, control proceeds to block 234. At block 234, controller 146 brings the standby pumping unit, 120' in this example, online so that standby pumping unit 120' can provide pressurized fluid flow. Control then proceeds to block 236 where controller 146 places the standby pumping unit 120' into the cooling loop of the fault condition pumping unit 120. This occurs by opening respective inlet valves 212 and outlet valves 208. This enables pumping unit 120' to provide fluid flow to load 122. Control then proceeds to block 238 where the fault condition pumping unit 120 is removed from the circuit. Controller 146 removes the fault condition pumping unit 120 by closing its corresponding inlet valve 220 and outlet valve 218 in order to take the fault condition pumping unit out of its respective cooling loop.

Control proceeds to decision block 240. At decision block 240, controller 146, or other portions of the system, determine when the fault condition pumping unit is determined to be operating properly. If the fault condition pumping unit is not operating properly, control returns to decision block 240. If the fault condition pumping unit is operating properly, control proceeds to block 242, and controller 146 brings the now properly operating pumping unit 120 back online so that it can be reinserted into its respective cooling loop to provide fluid flow of cooling fluid to the loads 122. Once the fault condition pumping unit is brought online, control proceeds to block 244. At block 244, the fault condition pumping unit is placed into its respective cooling loop by opening its respective inlet valve 220 and outlet valve 218. Control then proceeds to block 246. At block 226, controller 146 removes the standby pumping unit 120' from the cooling loop by closing respective standby inlet valve 212 and outlet valve 208. Control then proceeds to block 248 which takes redundant pumping unit 120' offline. Control then proceeds to end block 250.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for providing redundant control of a cooling system comprising:
   providing a plurality of primary cooling modules, the primary cooling modules circulating refrigerant through a respective circuit including a thermal load;
   providing a secondary cooling module, the secondary cooling module selectively providing a supplemental flow of refrigerant through the circuit associated with a respective primary cooling module when a fault is detected in one of the primary cooling modules;
   transitioning the secondary cooling module from a standby mode of operation to an online mode of operation upon detection of the fault in one of the primary cooling modules; and
   arranging valves disposed between the one primary cooling module and the circuit to prevent refrigerant flow therebetween.

2. The method of claim 1 further comprising:
   inserting the secondary cooling module into a circuit of the one primary cooling module, the secondary cooling module providing cooling fluid to the circuit; and
   deactivating the one primary cooling module.

3. The method of claim 2 further comprising returning the cooling system to normal operation comprising:
   transitioning the one primary cooling module from a standby mode of operation to an online mode of operation when the fault is no longer detected;
   arranging the valves disposed between the one primary cooling module and the circuit to enable refrigerant flow therebetween; and
   deactivating the secondary cooling module.

4. The method of claim 3 further comprising removing the secondary cooling module from the circuit.

5. The method of claim 2 further comprising:
   supplying refrigerant at a first temperature to the circuit associated with the respective primary cooling module; and
   receiving refrigerant from the circuit associated with the respective primary cooling module, the refrigerant received by a first condenser being at a higher temperature than the first temperature.

6. The method of claim 2 further comprising:
   controlling fluid flow between an inlet of the respective circuit of the one of the primary cooling modules for which the fault has been detected and the secondary cooling module; and
   controlling fluid flow between an outlet of the respective circuit of the one of the primary cooling modules for which the fault has been detected and the secondary cooling module.

7. The method of claim 6 further comprising:
   supplying refrigerant at a first temperature to the circuit associated with the primary cooling module for which the fault has been detected; and
   receiving refrigerant from the circuit associated with the primary cooling module for which the fault has been detected, the refrigerant received from the circuit being at a higher temperature than the first temperature.

8. The method of claim 7 further comprising receiving refrigerant in a liquid state from a second condenser.

9. The method of claim 1 further comprising receiving refrigerant in a liquid state from a second condenser.

10. The method of claim 1 further comprising:
supplying refrigerant at a first temperature to the circuit it associated with the respective primary cooling module; and
receiving refrigerant from the circuit associated with the respective primary cooling module, the refrigerant received by a first condenser being at a higher temperature than the first temperature.

11. The method of claim 1 further comprising:
supplying refrigerant at a first temperature to the circuit associated with the primary cooling module for which the fault has been detected; and
receiving refrigerant from the circuit associated with the primary cooling module for which a fault has been detected, the refrigerant received from the circuit being at a higher temperature than the first temperature.

12. The method of claim 1 further comprising:
controlling fluid flow between an inlet of the respective circuit of the one of the primary cooling modules for which the fault has been detected and the secondary cooling module; and
controlling fluid flow between an outlet of the respective circuit of the one of the primary cooling modules for which the fault has been detected and the secondary cooling module.

13. A method for providing redundant control of a cooling system comprising:
providing a plurality of primary cooling modules, the primary cooling modules circulating refrigerant through a respective thermal load;
providing a secondary cooling module, the secondary cooling module selectively providing a supplemental flow of refrigerant through the load associated with a respective primary cooling module when a fault is detected in one of the primary cooling modules;
transitioning the secondary cooling module from a standby mode of operation to an online mode of operation upon detection of the fault in one of the primary cooling modules;
inserting the secondary cooling module into a circuit of the one primary cooling module, the secondary cooling module providing cooling fluid to the load;
deactivating the one primary cooling module; and
when returning the cooling system to normal operation:
activating the one primary cooling module when the fault is no longer detected;
inserting the one primary cooling module into the circuit for providing cooling fluid to the load; and
deactivating the secondary cooling module.

14. The method of claim 13 further comprising removing the one primary cooling module from a circuit.

15. The method of claim 13 further comprising removing the secondary cooling module from the circuit.

16. The method of claim 13 further comprising:
supplying refrigerant at a first temperature to the load associated with the respective primary cooling module; and
receiving refrigerant from the load associated with the respective primary cooling module, the refrigerant received by a first condenser being at a higher temperature than the first temperature.

17. The method of claim 13 further comprising:
controlling fluid flow between an inlet of the respective load of the one of the primary cooling modules for which the fault has been detected and the secondary cooling module; and
controlling fluid flow between an outlet of the respective load of the one of the primary cooling modules for which the fault has been detected and the secondary cooling module.

18. The method of claim 13 further comprising:
supplying refrigerant at a first temperature to the load associated with the primary cooling module for which the fault has been detected; and
receiving refrigerant from the load associated with the primary cooling module for which the fault has been detected, the refrigerant received from the load being at a higher temperature than the first temperature.

19. The method of claim 18 further comprising receiving refrigerant in a liquid state from a second condenser.

20. The method of claim 18 further receiving refrigerant in a liquid state from a second condenser.

21. The method of claim 13 further comprising:
supplying refrigerant at a first temperature to the load associated with the respective primary cooling module; and
receiving refrigerant from the load associated with the respective primary cooling module, the refrigerant received by a first condenser being at a higher temperature than the first temperature.

22. The method of claim 13 further comprising:
supplying refrigerant at a first temperature to the load associated with the primary cooling module for which the fault has been detected; and
receiving refrigerant from the load associated with the primary cooling module for which a fault has been detected, the refrigerant received from the load being at a higher temperature than the first temperature.

23. A method for providing redundant control of a cooling system comprising:
providing a plurality of primary cooling modules, the primary cooling modules circulating refrigerant through a respective thermal load;
providing a secondary cooling module, the secondary cooling module selectively providing a supplemental flow of refrigerant through the load associated with a respective primary cooling module when a fault is detected in one of the primary cooling modules;
transitioning the secondary cooling module from a standby mode of operation to an online mode of operation upon detection of the fault in one of the primary cooling modules;
inserting the secondary cooling module into a circuit of the one primary cooling module, the secondary cooling module providing cooling fluid to the load;
deactivating the one primary cooling module;
controlling fluid flow between an inlet of the respective load of the one of the primary cooling modules for which the fault has been detected and the secondary cooling module; and
controlling fluid flow between an outlet of the respective load of the one of the primary cooling modules for which the fault has been detected and the secondary cooling module.

24. The method of claim 23 further comprising removing the one primary cooling module from a circuit.

25. The method of claim 23 further comprising returning the cooling system to normal operation comprising:
activating the one primary cooling module when the fault is no longer detected;
inserting the one primary cooling module into the circuit for providing cooling fluid to the load; and
deactivating the secondary cooling module.

26. The method of claim 25 further comprising removing the secondary cooling module from the circuit.

27. The method of claim 25 further comprising:
supplying refrigerant at a first temperature to the load associated with the respective primary cooling module; and
receiving refrigerant from the load associated with the respective primary cooling module, the refrigerant received by a first condenser being at a higher temperature than the first temperature.

28. The method of claim 23 further comprising:
supplying refrigerant at a first temperature to the load associated with the primary cooling module for which the fault has been detected; and
receiving refrigerant from the load associated with the primary cooling module for which a fault has been detected, the refrigerant received from the load being at a higher temperature than the first temperature.

29. The method of claim 28 further comprising receiving refrigerant in a liquid state from a second condenser.

30. The method of claim 23 further comprising:
supplying refrigerant at a first temperature to the load associated with the respective primary cooling module; and
receiving refrigerant from the load associated with the respective primary cooling module, the refrigerant received by a first condenser being at a higher temperature than the first temperature.

31. A method for providing redundant control of a cooling system comprising:
providing a plurality of primary cooling modules, the primary cooling modules circulating refrigerant through a respective thermal load;
providing a secondary cooling module, the secondary cooling module selectively providing a supplemental flow of refrigerant through the load associated with a respective primary cooling module when a fault is detected in one of the primary cooling modules;
controlling fluid flow between an inlet of the respective load of the one of the primary cooling modules for which the fault has been detected and the secondary cooling module;
transitioning the secondary cooling module from a standby mode of operation to an online mode of operation upon detection of the fault in one of the primary cooling modules, and
controlling fluid flow between an outlet of the respective load of the one of the primary cooling modules for which the fault has been detected and the secondary cooling module.

32. The method of claim 31 further comprising removing the one primary cooling module from a circuit associated with the one primary cooling module.

33. The method of claim 31 further comprising:
inserting the secondary cooling module into a circuit of the one primary cooling module, the secondary cooling module providing cooling fluid to the load; and
deactivating the one primary cooling module.

34. The method of claim 33 further comprising returning the cooling system to normal operation comprising:
activating the one primary cooling module when the fault is no longer detected;
inserting the one primary cooling module into the circuit for providing cooling fluid to the load; and
deactivating the secondary cooling module.

35. The method of claim 34 further comprising removing the secondary cooling module from the circuit.

36. The method of claim 33 further comprising:
supplying refrigerant at a first temperature to the load associated with the respective primary cooling module; and
receiving refrigerant from the load associated with the respective primary cooling module, the refrigerant received by a first condenser being at a higher temperature than the first temperature.

37. The method of claim 31 further comprising:
supplying refrigerant at a first temperature to the load associated with the primary cooling module for which the fault has been detected; and
receiving refrigerant from the load associated with the primary cooling module for which the fault has been detected, the refrigerant received from the load being at a higher temperature than the first temperature.

38. The method of claim 37 further comprising receiving refrigerant in a liquid state from a second condenser.

39. The method of claim 37 further receiving refrigerant in a liquid state from a second condenser.

40. The method of claim 31, further comprising:
supplying refrigerant at a first temperature to the load associated with the respective primary cooling module; and
receiving refrigerant from the load associated with the respective primary cooling module, the refrigerant received by a first condenser being at a higher temperature than the first temperature.

41. The method of claim 31 further comprising:
supplying refrigerant at a first temperature to the load associated with the primary cooling module for which the fault has been detected; and
receiving refrigerant from the load associated with the primary cooling module for which a fault has been detected, the refrigerant received from the load being at a higher temperature than the first temperature.

* * * * *